(12) United States Patent
Hunter et al.

(10) Patent No.: US 6,662,063 B2
(45) Date of Patent: Dec. 9, 2003

(54) METHOD AND SUBSYSTEM FOR DETERMINING A SEQUENCE IN WHICH MICROSTRUCTURES ARE TO BE PROCESSED AT A LASER-PROCESSING SITE

(75) Inventors: Bradley L. Hunter, Lexington, MA (US); Paul Andrei, Marlborough, MA (US)

(73) Assignee: GSI Lumonics Corporation, Northville, MI (US)

( * ) Notice: Subject to any disclaimer, the term of this patent is extended or adjusted under 35 U.S.C. 154(b) by 148 days.

(21) Appl. No.: 09/858,691

(22) Filed: May 16, 2001

(65) Prior Publication Data

US 2002/0004687 A1 Jan. 10, 2002

Related U.S. Application Data

(63) Continuation-in-part of application No. 09/572,925, filed on May 16, 2000, now Pat. No. 6,483,071.
(60) Provisional application No. 60/204,275, filed on May 16, 2000.

(51) Int. Cl.[7] .............................................. G06F 19/00
(52) U.S. Cl. ...................... 700/100; 700/100; 700/121; 700/166
(58) Field of Search ..................... 700/28, 96, 99–104, 700/108, 110, 121, 166, 169–171, 173, 174, 192; 438/907–908; 219/121.6

(56) References Cited

U.S. PATENT DOCUMENTS

| 4,510,565 A | * | 4/1985 | Dummermuth ............. 364/136 |
| 4,555,610 A | * | 11/1985 | Polad et al. .......... 219/121 LA |
| 4,710,908 A | | 12/1987 | Ohshima et al. ............... 369/32 |
| 4,778,693 A | * | 10/1988 | Drozdowicz et al. ...... 427/53.1 |
| 5,200,677 A | | 4/1993 | Dueck et al. ............... 318/567 |
| 5,594,235 A | | 1/1997 | Lee .......................... 250/201.3 |
| 5,690,785 A | | 11/1997 | Nakaya .................... 156/626.1 |

(List continued on next page.)

FOREIGN PATENT DOCUMENTS

| EP | 0 862 089 A2 | 9/1998 |
| EP | 0 864 929 A2 | 9/1998 |
| WO | WO 99/28798 | 6/1999 |
| WO | WO 00/17724 | 3/2000 |

OTHER PUBLICATIONS

The Microsoft Computer Dictionary, 4th edition, pp. 107, 238, 289, 402, 409, and 477.*

The Authoritative Dictionary of IEEE Standards Terms, 7th edition, pp. 215, 300, 570, 693, 1022, and 1052.*

(List continued on next page.)

*Primary Examiner*—Jayprakash N. Gandhi
*Assistant Examiner*—Sean Shechtman
(74) *Attorney, Agent, or Firm*—Brooks Kushman P.C.

(57) ABSTRACT

Method and subsystem are provided for determining a sequence in which microstructures are to be processed at a laser-processing site by taking into account microstructures located near travel limits of a motor-driven stage. The method includes receiving reference data which represent locations of microstructures to be processed at the site and coalescing adjacent groups of microstructures into clusters of microstructures including edge clusters which contain the microstructures located near the travel limits of the motor-driven stage which moves the microstructures relative to a laser beam at the site. The method also includes dividing a cluster fragment from each edge cluster. The cluster fragments contain the microstructures located near the travel limits. The method then includes sorting the clusters and cluster fragments to obtain data which represent a substantially optimum sequence in which the microstructures are to be processed to increase throughput at the site.

24 Claims, 4 Drawing Sheets

U.S. PATENT DOCUMENTS

| | | | |
|---|---|---|---|
| 5,783,814 A | | 7/1998 | Fairley et al. ............ 250/201.3 |
| 5,808,887 A | | 9/1998 | Dorst et al. ............ 364/167.01 |
| 5,824,604 A | * | 10/1998 | Bar-Gadda .................. 438/725 |
| 5,871,805 A | | 2/1999 | Lemelson ...................... 427/8 |
| 5,971,588 A | * | 10/1999 | Scepanovic et al. ... 364/468.28 |
| 6,239,406 B1 | | 5/2001 | Onoma et al. ......... 219/121.82 |
| 6,414,320 B1 | * | 7/2002 | Ishikawa et al. ............ 250/425 |
| 6,495,791 B2 | * | 12/2002 | Hunter et al. ............ 219/121.6 |

OTHER PUBLICATIONS

Kohno, Yoshiaki, Path Planning In Wafer Transfer System With Mobile Robot, Proceedings of the International Conference on Industrial Electronics, Control And Instrumentation, Industrial Applications of Mini, Micro & Personal Computers, Milwaukee, WI, 09/29—Oct. 3, 1986, vol. 2, pp. 811–816, XP000044825.

Marcel Dekker, Inc., Laser Beam Scanning, Opto–Mechanical Devices, Systems, and Data Storage Optics, Chapter 7, Optics for Data Storage, pp. 303–305, 384–387.

* cited by examiner

METHOD AND SUBSYSTEM FOR DETERMINING A SEQUENCE IN WHICH MICROSTRUCTURES ARE TO BE PROCESSED AT A LASER-PROCESSING SITE

CROSS-REFERENCE TO RELATED APPLICATIONS

This application claims the benefit of U.S. provisional application Serial No. 60/204,275, filed May 16, 2000, entitled "Trajectory Generation and Link Optimization." This application is a continuation-in-part of U.S. patent application Ser. No. 09/572,925, also filed May 16, 2000, entitled "Method and System for Precisely Positioning a Waist of a Material-Processing Laser Beam to Process Microstructures Within a Laser-Processing Site", now issued as U.S. Pat. No. 6,483,071.

BACKGROUND OF THE INVENTION

1. Field of the Invention

This invention relates to methods and subsystems for determining a sequence in which microstructures are to be processed at a laser-processing site.

2. Background Art

Memory repair is a process used in the manufacture of memory integrated circuits (DRAM or SRAM) to improve the manufacturing yield. Memory chips are manufactured with extra rows and columns of memory cells. During testing of the memory chips (while still in the wafer form), any defects found are noted in a database. Wafers that have defective die can be repaired by severing links with a pulsed laser. Systems generally utilize wafer-handling equipment that transports semiconductor wafers to the laser process machine, and obtain the information in the form of an associated database specifying where the links should be cut and perform the requisite link ablation for each wafer.

Successive generations of DRAM exploit finer device geometry in order to pack more memory into smaller die. This manufacture of smaller devices affects the geometry of the links allocated for laser redundancy. As the devices get smaller, the links get smaller and the pitch (link-to-link spacing) shrinks as well. Smaller link geometry requires a smaller spot size from the laser in order to successfully remove selected links without affecting adjacent links, preferably with little if any compromise in throughput.

Links are arranged in small groups on a common pitch. Typical groups might consist of 20–50 links that are about 0.8 $\mu$M wide, 6 $\mu$M long and spaced on a 3 $\mu$M pitch. The groups can be arranged with the pitch vector parallel to either the x or y axis. Frequently, multiple groups will be found to be co-linear with as little as 2 or 3 "pitches" between the end of one group and the start of the next. At other times, the co-linear groups may be spaced many hundreds of microns apart. A typical DRAM die might have a few hundred groups of links distributed across the extend of the die.

The above-noted utility patent application discloses a high-performance x-y stage that is used to position a semiconductor wafer underneath a stationary laser beam. The x-y stage is required to make many high-speed motions in the course of processing a region of the wafer.

Typical x-y stages are limited by position, velocity, acceleration and voltage constraints. The position constraints are the limits of travel of the stage. The velocity constraints may be due to limits on the positioning sensing devices used in the stage and/or limits imposed by the type of bearings used. Acceleration constraints are usually due to limits on the current available to drive the stage due to motor, amplifier or power supply considerations. Voltage constraints are encountered less frequently. Movements that require excess voltage must be avoided in order to avoid amplifier saturation. Voltage constraints are typically encountered during brief high-acceleration moves.

The stage is able to execute a motion using a relatively large value of acceleration (as high as 3 G's) and to stop rapidly at the end of the motion. The stage also must operation with extremely high precision (nanometer level of precision). The combination of very high performance and extreme accuracy requirements places additional constraints of the stage. The stage is sensitive to the level of power dissipated in the motor windings. If the power dissipated causes the winding temperature to rise more than 2° C., then the precision of the stage will be compromised. Also, if the spectral content of the forces applied to the stage contains an excessive level of energy at frequencies above the first mechanical mode of the system, then resonances in the mechanical elements of the stage will be excited. These resonances will either compromise accuracy or require extra settling time at the end of a motion before the requisite level of precision will be achieved.

SUMMARY OF THE INVENTION

An object of the present invention is to provide an improved method and subsystem for determining a sequence in which microstructures are to be processed at a laser-processing site.

In carrying out the above object and other objects of the present invention, a method for determining a sequence in which microstructures are to be processed at a laser-processing site is provided. The method includes receiving reference data which represent locations of microstructures to be processed at the site. The method also includes coalescing adjacent groups of microstructures into clusters of microstructures including edge clusters which contain microstructures located near travel limits of a motor-driven stage which moves the microstructures relative to a laser beam at the site. The method also includes dividing a cluster fragment from each edge cluster wherein the cluster fragments contain the microstructures located near the travel limits. The method further includes sorting the clusters and cluster fragments to obtain data which represent a substantially optimum sequence in which the microstructures are to be processed to increase throughput at the site.

The step of sorting may be based on energy expended in at least one coil of at least one motor in response to motor commands.

Each of the cluster and cluster fragments may have a plurality of possible processing directions and wherein the step of sorting may include the step of determining a substantially optimum direction in which to process the micro structures.

The step of sorting may include the steps of selecting a substantially optimum cluster or cluster fragment to be initially processed at the site, then determining a plurality of possible sequences for processing the remaining clusters and cluster fragments and selecting a substantially optimum sequence from the plurality of possible sequences.

The microstructures may be located on dice of a wafer.

Further in carrying out the above object and other objects of the present invention, a subsystem for determining a sequence in which microstructures are to be processed at a laser-processing site is provided. The subsystem includes means for receiving reference data which represent locations of microstructures to be processed at the site. The subsystem also includes means for coalescing adjacent groups of microstructures into clusters of microstructures including edge clusters which contain microstructures located near travel limits of a motor-driven stage which moves the microstructures relative to a laser beam at the site. The subsystem further includes means for dividing a cluster fragment from each edge cluster wherein the cluster fragments contain the microstructures located near the travel limits. Further, the subsystem includes means for sorting the clusters and cluster fragments to obtain data which represent a substantially optimum sequence in which the microstructures are to be processed to increase throughput at the site.

The means for sorting may sort based on energy expended in at least one coil of at least one motor in response to motor commands.

Each of the clusters and cluster fragments may have a plurality of possible processing directions and wherein the means for sorting includes means for determining a substantially optimum direction in which to process the microstructures.

The means for sorting may include means for selecting a substantially optimum cluster or cluster fragment to be initially processed at the site, for determining a plurality of possible sequences for processing the remaining clusters and cluster fragments and for selecting a substantially optimum sequence from the plurality of possible sequences.

The microstructures may be conductive lines of the dice and wherein the conductive lines may be metal lines.

The dice may be semiconductor memory devices and wherein the conductive lines are to be ablated at the site to repair defective memory cells of the devices.

The microstructures may be parts of a semiconductor device and wherein the semiconductor device may be a microelectromechanical device.

The semiconductor device may also be a silicon semiconductor device.

The semiconductor device may further be a semiconductor memory.

The microstructures may be parts of a microelectronic device.

The microstructures in each group may have a substantially common pitch.

The stage is may be an x-y stage and wherein the means for sorting may sort based on energy expended in a plurality of coils of a plurality of motors in response to motor commands.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1:
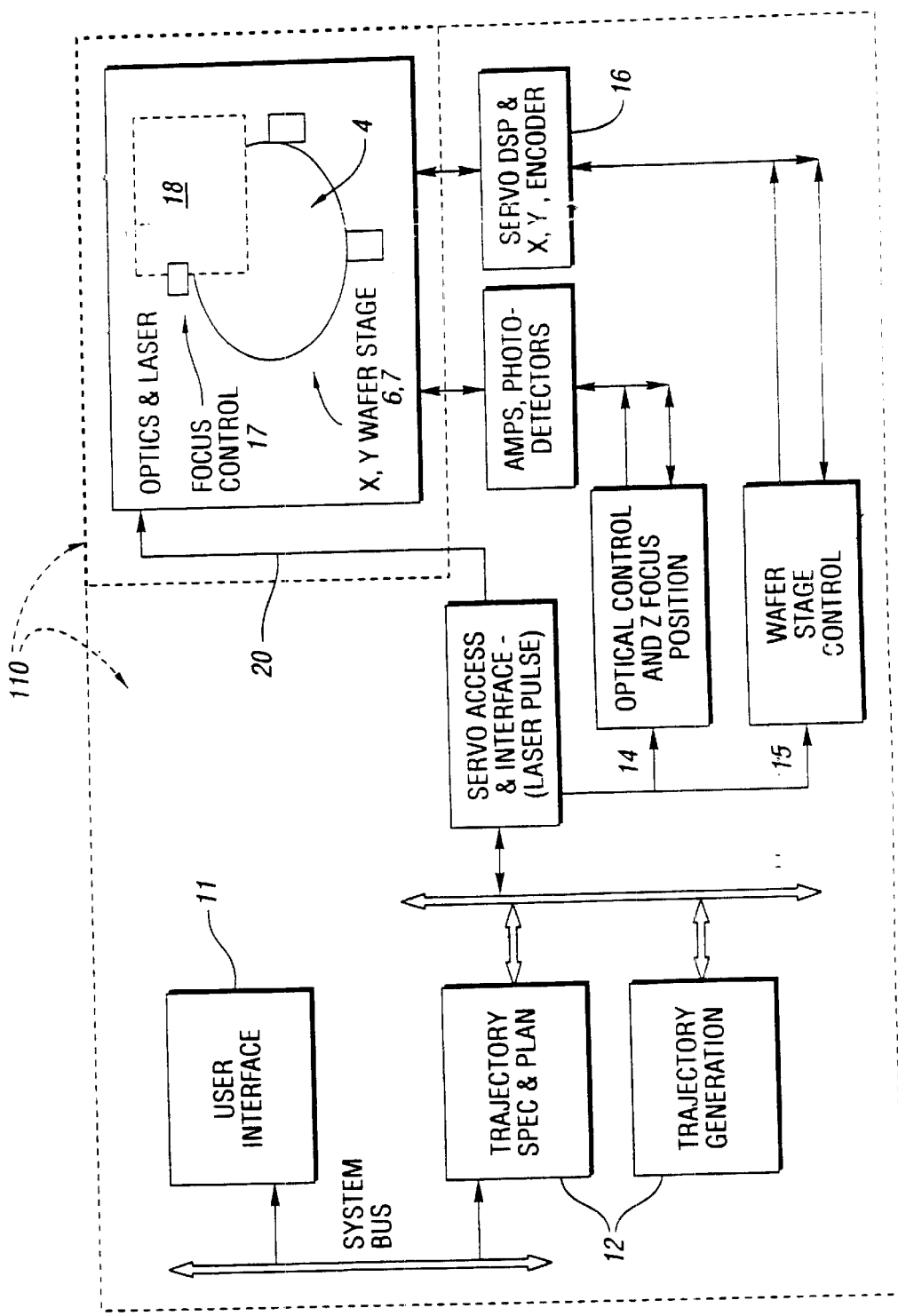
FIG. 1 is a detailed schematic block diagram of a memory repair system in accordance with the present invention showing the major subsystems.

A laser processing system, generally indicated at 110, is shown in FIG. 1. A wafer 4 is positioned within the laser processing system 110 and database information from a user interface 11 is provided to identify links (33 in FIG. 3) on the wafer 4 which are to be ablated to repair defective memory cells 31.

The database information is used by a trajectory planner 12 and a DSP-based controller 15,16 in conjunction with motion stage 6, 7, calibration to define motion segments for the trajectory generator which are executed and coordinated with a laser, focusing optics, and x-y stage 6, 7 operation to ablate links, as shown in the above-noted utility application. This operation includes control of x-y motion with preferred high-speed precision stages 6, 7 and simultaneous positioning of optical elements to position the beam waist of the processing laser (not shown) to coincide with a coordinate of the link 33 when the laser is pulsed.

All memory repair systems include some dynamic mechanism to provide relative motion between the wafer surface and the focal plane. In some cases, this may involve controlling the height of the wafer 4 relative to a fixed height optical path by movement along the z-axis. Alternatively, the motion may utilize movement of a focusing lens in a "stepwise" manner to coincide with a location in depth derived from focus data from a die of site.

With the present system, the overall height of the wafer remains constant and the final objective lens height is controlled by a linear servo mechanism and controller 14,17 for an optics box 18. The positioning of the lens or optical element with a preferred arrangement using a precision positioning system for z-axis movement provides z-axis resolution of about 0.1 $\mu$m or finer with a 3DB "small signal" bandwidth of about 150 Hz, over a typical maximum range of movement of about 3 mm.

The "trajectory planner" 12 is utilized to plan the path of the wafer 4 and beam waist position 5 with a motion system 6, 7, 17 and associated DSP based controller 16. The trajectory planner integrates information from the user interface and alignment system 11 that is used to define the position of the laser relative to the targets (the latter typically mounted on a precision stage, for instance, a wafer stage) in a coordinate system. From the database the information is derived, resulting in a "link map", die selection, and other pertinent data regarding the memory repair operation.

Those skilled in the art of motion control and estimation will appreciate the tolerance budget requirement for accurate three-dimensional positioning in a high-speed memory repair processing system. A fraction of a micron, over a maximum range of travel of about 300 mm or more, corresponds to the entire area of a modern wafer. Processing or "cutting speeds" exceeding 50 mm/sec. are advantageous. Also, U.S. Pat. No. 6,144,118, hereby incorporated by reference, describes details of a preferred wafer positioning system.

Figure 3:
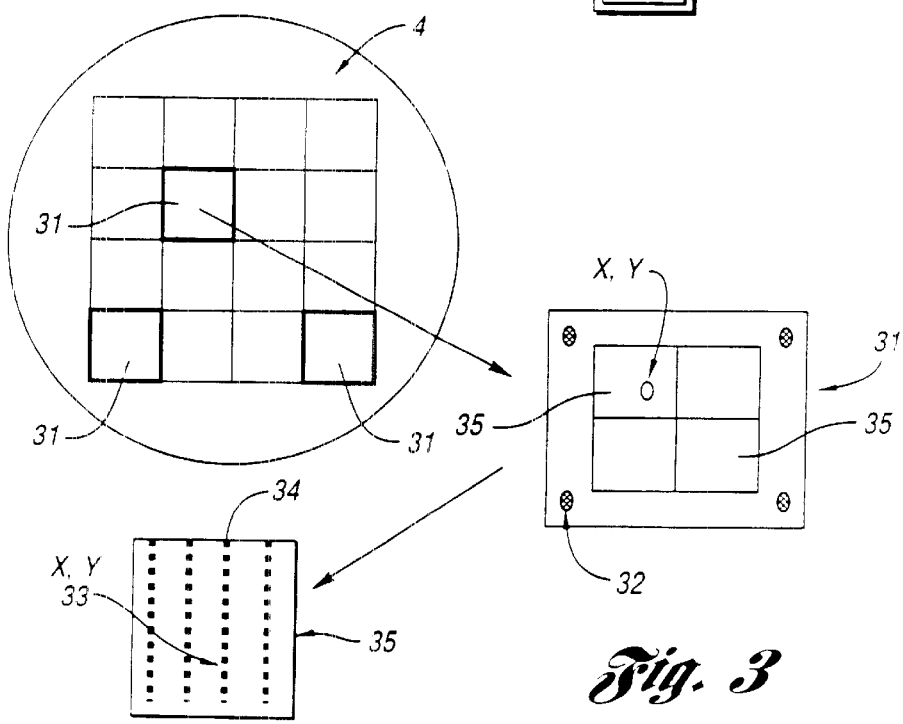
FIG. 3 is an exemplary illustration showing a wafer processing site comprising several die, die sites, groups of links and associated regions where reference regions are located to define a reference surface.

Referring now to FIG. 3, a system for link blowing will generally require processing (i.e. laser ablation) of a subset 33 of a large number of links 34 on the wafer 4. The information which defines the links to be processed is provided to a control program. The program in turn will define a set of reference locations 32 surrounding a number of die 35 to be processed—i.e. a die site. The locations will generally include a sufficient number of points to accurately define a trajectory to be followed by the wafer and lens system based upon commands generated for motion system control as described in the above-noted utility application.

Generating the Laser Pulse

The laser-processing beam is typically provided by a Q-switched YAG laser having a pre-determined pulse width, repetition rate, and wavelength as disclosed in U.S. Pat. No. 5,998,759. A control signal 20 is supplied to the laser which generates a pulse in coordination with the continuous positioning of the wafer and lens. Those skilled in the art will recognize the coordination of the laser and motion will most likely be compounded by instantaneous or cumulative position error. In a preferred embodiment a programmable firing delay is included that adjusts the previously "scheduled" laser pulses to compensate for such position errors. The time resolution of such correction is preferably 25 nanoseconds or less. Preferably, the complete error correction is defined by a "tracking vector" which converts the total position error into a delay. This tracking vector can be included with transformation matrices which are operatively connected to the controller for dynamically relating coordinate systems.

Figure 2:
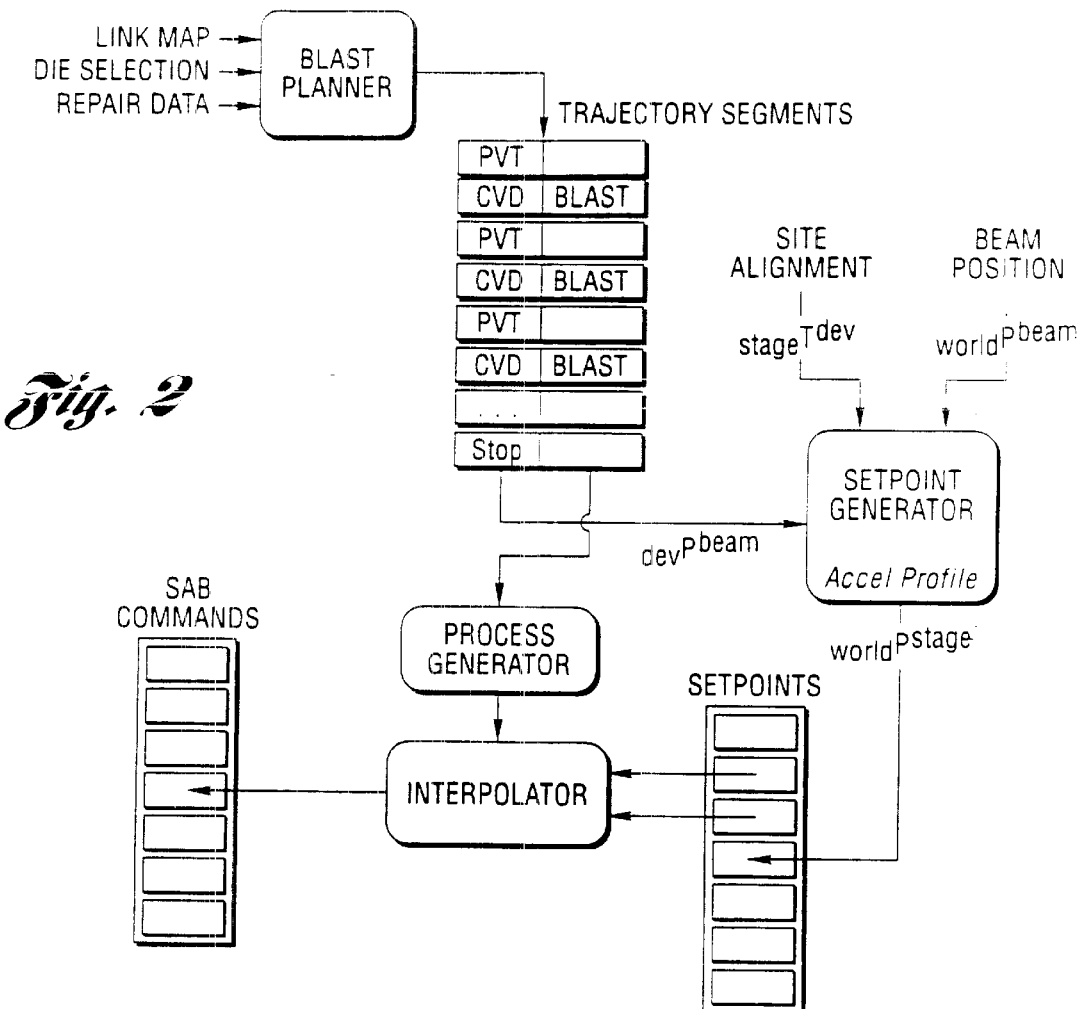
FIG. 2 is a diagram of system architecture with trajectory data flow.

Referring now to FIG. 2, trajectory generation is the process of specifying, representing, and realizing continuous motion paths. For the system described here, there is a need to synchronize the moving stage and laser firing so that each link is blasted on center. The trajectory generation architecture is illustrated in FIG. 2. Beam motion is accomplished by computing segments from application data; setpoints from segments; and servo commands from setpoints.

The most significant functional entities in this scheme are the planner, generator, and interpolator. The planner constructs the path for the stage by analyzing domain-specific data, e.g. link map and repair data. The output of this module is a trajectory: a list of motion segments each optionally paired with a control segment.

When the three-dimensional coordinates of the laser beam and links to be processed are determined, a motion control program utilizes the trajectory planner or generator 12 of FIG. 1 to efficiently process the target structures.

Figure 4:
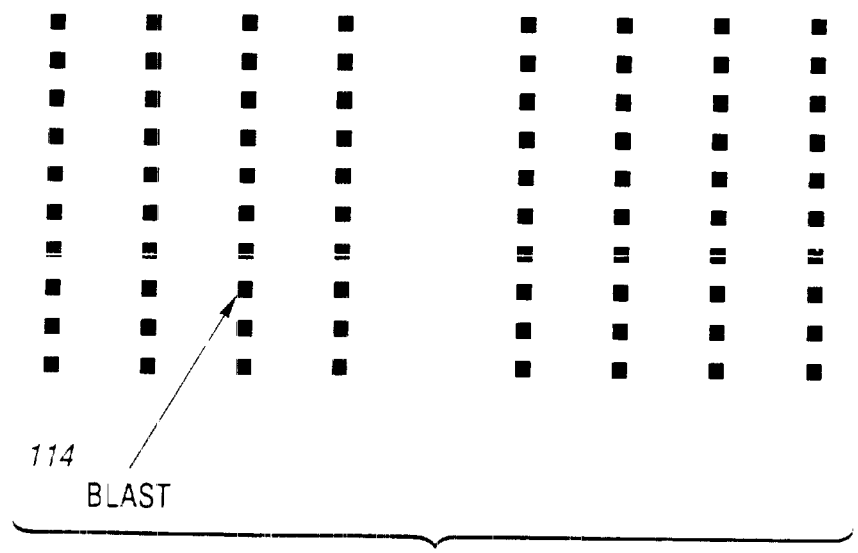
FIG. 4 is a schematic view of rows of links of side-by-side dice to be processed within a die site.
Figure 5:
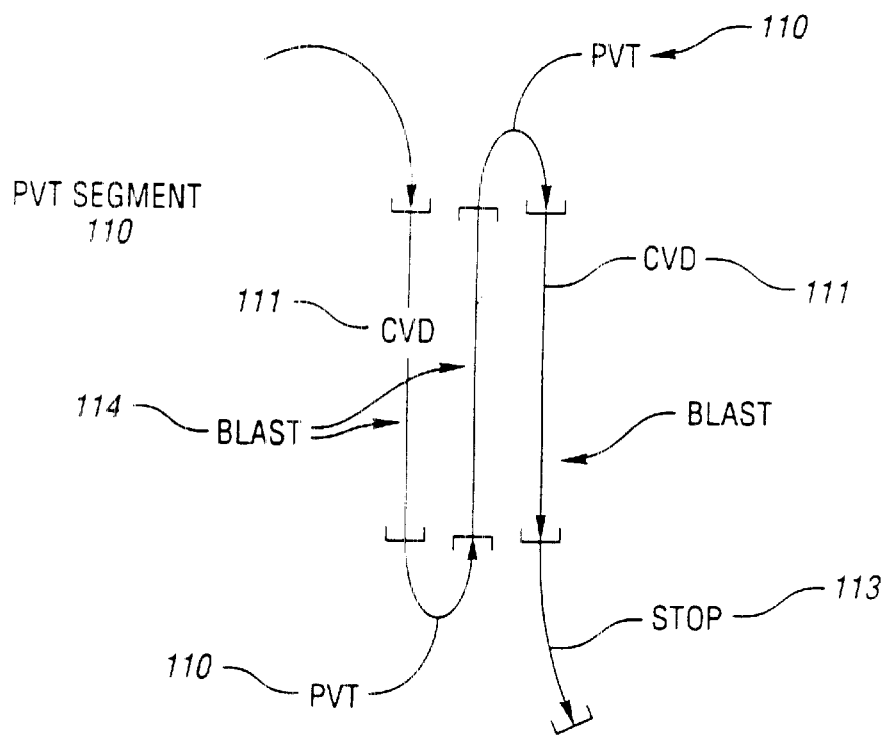
FIG. 5 is a schematic view of various motion segment types.

Referring now to FIGS. 4 and 5, in a preferred system the acceleration and velocity profiles are associated with the following "motion segment" types:

1. PVT (Position/Velocity/Time) segment 110. It is used to accelerate to a desired position and velocity. The time required to traverse this segment is optional; if not specified, the minimum time is computed.
2. CVD (Constant-Velocity/Distance) segment 111. This type has only a single scalar specification: path length of the segment. The beam is to move at constant velocity for the specified distance. The velocity is that specified by the endpoint of the previous segment. Process control is typically executed during a CVD segment.
3. CVT (Constant-Velocity/Time) segment. This is the same as the CVD segment, but he segment's duration is specified rather than its length.
4. Stop Segment 113. This segment takes no specifications—it stops the stage as quickly as possible.

"Blast" refers to firing of the laser pulse to sever the links 114. Furthermore, a "stop" segment terminates motion, preferably as fast as possible. Process control and link blowing are most often associated with the constant velocity segment.

In a preferred system acceleration and velocity profiles are used to generate the x-y motion in cooperation with the DSP-based servo controller 16. The lens translations along the optical axis are coordinated with the x, y motion so that the beam waist will be positioned at the target location when the laser is pulsed. The z coordinate of the beam waist may be dynamically adjusted between any two structures on the wafer, including adjacent structures arranged in a row (along x or y direction) on a single die. The incremental z-axis resolution (smallest height difference) for link blowing is preferably about 0.1 um, for example, with about 0.05 um at the limit.

The problem addressed by path planning within the system is as follows: Given initial and final position and velocity (vector) specifications, find the "optimum" trajectory that satisfies the end-point conditions as well as the constraints on position envelope, maximum velocity, maximum acceleration and maximum voltage.

The optimum trajectory minimizes the "cost" of the trajectory. The "cost" for a given trajectory is the weighted sum of the trajectory time and the energy dissipated in the motor coils. The weighting factor for time is always unit (1.0). The weighting factor for energy is variable.

Many trajectories may satisfy the required end-point conditions as well as satisfy the system constraints. However, there may be a large variation in the cost associated with the multiple solutions. The algorithm of the present invention finds the optimum (lowest "cost") and uses that trajectory to execute a motion.

Consider a simple example. A trajectory specification frequently encountered in performing memory repair is called a "merge." Laser processing is required along two short line segments that are nearby. The segments are co-linear and the segments are processed at the same constant velocity. A gap exists between the co-linear segments. A "CV" segment might be used to traverse the gap (i.e., a constant velocity segment using the same velocity as the preceding segment). Alternatively, the gap might be traversed in slightly less time by a brief acceleration/deceleration profile. The cost of the CV solution is simply the time required to cross the gap (distance/velocity), since a CV segment involves no energy dissipation. However, an accel/decel profile will require less time but at a greater expenditure of energy. The optimum selection in this case depends upon the relative weighting of energy dissipation versus time in the cost function.

Motion Profiles

A trajectory segments consists of one or more intervals. An interval is defined as a subset of the trajectory during which the acceleration is constrained to be a predetermined function of two variables: APK (peak acceleration amplitude) and Tint (duration of the interval). The form of the acceleration profile is either cycloidal or harmonic. Since the form is predetermined, only the amplitude and duration are needed to completely specify the motion during a trajectory interval.

A trajectory is composed of a sequence of contiguous (in time, position, velocity, acceleration and jerk) intervals with each interval having variable duration and acceleration amplitude (possibly zero). Note that a CV (constant velocity) trajectory segment is a single interval with APK=0.

The system of FIG. 1 performs a sequence of trajectories as a single motion profile. A single motion profile may last many seconds and consist of hundreds of trajectory segments. Multiple intervals are typically required to satisfy the end-point specifications for a trajectory segment. Intervals can be generically described as either "C" or "P" corresponding to "cruise" or "pulse." A C-segment is characterized by APK=0. A P-segment has non-zero APK.

In the merge example given earlier, the cruise solution consists of a single "C" interval, whereas the accel/decel solution is a "P-P" solution. Other segment combinations are required to handle the variety of trajectory specifications required for the system of FIG. 1: (C, CP, PC, PP, PCP, PPPP, PPCPP).

Not all solution forms can be applied to a given trajectory segment. For example, a trajectory segment that contains different initial and final velocities (Vi< >Vf) cannot be satisfied with a C interval.

Solution Strategy

The solution for CVT or CVD segments is trivial (zero acceleration for the specified time or distance). Since time is specified and energy dissipation is zero, there is no optimization to be performed. The CV segment will not be discussed further.

The solution for a PVT trajectory segment is more complicated. The solution involves the following steps:
1. Decompose the vector specification into x and y axis specifications.
2. Find the minimum cost solution independently for each axis.
3. Take the time for the slowest axis and find a solution for the "fast" axis that is minimum cost subject to the same "slow" elapsed time.

The minimum cost solution for a single axis involves the following steps:
1. Find the optimum solution for each relevant solution form (i.e., C, P, PC, CP, etc.).
2. Choose the best solution from amongst the multiple forms (if multiple solutions exist).

The relative cost of energy is controlled by a variable (Kp). Kp is used in the cost formulation as follows:

$$Cost = T + E/Kp$$

Note that Kp has dimensionality of power. This gives an intuitive basis for selecting Kp. If Kp is set to be large, then the cost of dissipated energy is made small. The resulting solutions will be minimum time. Conversely, setting Kp to be small makes energy "expensive" and hence solutions will tend to minimize power at the expense of time.

Since Kp is a variable, it can be set dynamically. The system of FIG. 1 exploits this capability to provide a further level of control over power dissipation (and hence improve accuracy). During production operations, the path planning algorithm is provided with a sequence of trajectory segments that must be followed. The path planning algorithm determines the energy that will be dissipated during each motion segment. Using a simple first-order model of the thermal response of the windings, the path planning algorithm predicts the temperature rise that will result from the energy dissipation history of the trajectory.

During trajectory segments that involve many short acceleration segments, the estimated temperature may rise more than desired. The path planning algorithm will then reduce the value of Kp in order to bias the motion optimization solution toward lower power intervals. Conversely, the path planning algorithm will increase Kp when the estimated temperature rise is very small.

Simulations performed with real memory repair data reveal that this dynamic adjustment of the relative cost of time versus energy reduces the variation in motor temperature. The accuracy of the system of FIG. 1 is sensitive to the rate of change of temperature (but not particularly sensitive to any particular temperature). The primary source of variation in stage temperature is due to variation in motor dissipation as a result of trajectories. The dynamic adjustment of Kp as a function of estimated temperature significantly reduces the variation and leads to higher precision.

When executing typical memory repair trajectories, the level of power dissipation in the motors is strongly influenced by Kp. However, the overall throughput of the system is a weak function of Kp. Thus, the component of stage error due to motor dissipation can be effectively controlled with a minor impact on overall throughput. Since the x-y stage is significantly faster than competitive offerings, this form of precision control can be achieved with insignificant impact on market acceptance.

Solution Benefits

The optimized multi-pulse solution provides the following benefits:

Continuous Smooth Motion

The path planning algorithm allows continuous motions in an x-y plane with a minimum of stops. The motion profiles are free of any discontinuities in position and all higher derivatives through jerk (derivative of acceleration). This implicitly limits the spectral content of the forces applied to the stage, thereby reducing the excitation of mechanical resonances in the stage and supporting structure.

Reduced Power Dissipation

The trajectories are optimum (based on the relative importance of time versus power dissipation).

Minimum Variation in Dissipation

By controlling Kp as a function of predicted motor temperature, a simple means of reducing temperature variation and thereby increasing precision is achieved.

Link Optimization

As previously mentioned, the order in which the links to be cut are specified is seldom the optimum order in which to conduct the link cutting process. The algorithm described here re-orders the links and thereby achieves: 1) a reduction in the execution time; 2) motor power dissipation; and 3) spectral content of forces applied to the system. Reduced execution time leads to higher productivity for the system. Reduced motor power dissipation improves the accuracy of the system. Reduced spectral content of forces improves accuracy and throughput by avoiding the excitation of structural resonances that would otherwise cause positioning errors.

The algorithm is modeled after the well known "traveling salesman" problem. In this case, however, we are interested in minimizing the cost to visit each link group as opposed to simply the time to visit each group. The sorting algorithm also conveniently handles some special cases and conditions that have limited the performance of previous generation memory repair systems.

The system of FIG. 1 typically processes multiple die with a single "site." The field size of the system may allow as many as six or eight 64M DRAM die to be processed at one time. This process is called multi-die align (MDA). The use of MDA affords a significant throughput improvement by reducing the number of alignment operations required to process the wafer from 1-per die to 1-per site. The alignment operation may require roughly the same amount of time to perform as link cutting for a single die.

MDA introduces another opportunity to exploit link re-ordering to improve throughput. Link groups in adjacent die may be co-linear. Processing co-linear groups without an intervening PVT motion segment (i.e., accel/decel segment) is often the best solution. The link sorting algorithm considers all groups within a site in order to find the optimum sequence.

Algorithm

The algorithm is as follows:

1. Gather all link groups within the site that need to be processed. This often involves reading a "repair file" having repair data as shown in FIG. 2 and possibly performing a transformation of the customer data format to an internal representation of the links to be cut.
2. Coalesce adjacent groups. While reading the list of link groups to cut, "coalesce" adjacent groups into "clusters." Adjacent groups are coalesced if they are co-linear, the groups can be processed at the same velocity and the gap between the end of one group and the start of the next is greater than a minimum dimension and less than a maximum dimension.
3. Identify "edge" groups. If the end of a cluster comes too close to the physical limits of the stage envelope, the stage may not have sufficient acceleration to process the group at full speed and stop before "crashing" into the stage travel limits. The cluster is cut into two clusters by assigning all links that are "close" to the edge to a new cluster with the balance remaining in the original cluster. A new, lower velocity is assigned to the edge cluster such that the stage does have sufficient room to reach the new cutting velocity within the distance between the last link of the new group and the physical limits of the stage travel.
4. Sort the clusters. The input to the sort is the (arbitrarily) ordered list of clusters with an (arbitrary) direction assigned to each cluster. (Direction refers to the direction, forward or reverse, in which the links in the cluster will be traversed). The output of the sort process is a new order of the same link groups with a new direction assigned to each. The re-ordered list is optimum.
5. Process the groups. The ordered list of groups is supplied as input to the path planning algorithm. The groups are processed in the prescribed order using a single continuous-motion trajectory that traverses the entire set of links.

Edge Clusters

A challenge for any memory repair system is to process groups that occur near to the travel limits. The distance required to come to a stop is a function of the square of the velocity and the reciprocal of acceleration. In the system of FIG. 1, a compromise was made during the design of the x-y stage to restrict the amount of "overtravel" available between the extreme of the user travel range and the physical limits of travel. The restriction was selected as part of the optimization of the motor design for the x-y stage.

The limited distance between the edge of the user envelope and the physical limits of travel (about 200 $\mu$M) is insufficient for the stage to come to a stop if it is traveling at the maximum cutting velocity (150 mm/sec) at the edge of the user envelope. One solution would be to reduce the maximum cutting velocity to ensure that the stage could always stop. This is undesirable since it unnecessarily increases processing time for interior link groups. Another solution would be to apply a lower velocity to the entire cluster. This also entails unnecessarily increasing processing time.

The solution adopted herein is to subject the minimum number of links to the lower velocity constraint. The original cluster is split at the first link not subject to the reduced speed constraint regardless of where the original group boundary occurs. Furthermore, the velocity assigned to the "edge" links is selected to be an integral fraction (1/n) of the nominal velocity. An example will help to explain the benefit of this scheme.

Assume the original group has a link pitch of 4 $\mu$M. Furthermore, assume the maximum Q-rate allowed for the particular laser in use is 20,000 pulses per sec. The maximum velocity during processing will be 80 mm/sec. For a harmonic acceleration profile subject to a maximum of 30 M/sec$^2$, the stage will require ~200 $\mu$M to come to a stop (same to go from stop to cutting velocity). Let's assume that some of the links in the group are sufficiently close to the edge of the user envelope that they will require a lower cutting velocity. The actual velocity selected for the fragment of the original cluster will be selected based on the minimum value for n such that the new velocity will equal the original velocity divided by n. The value for n is found interactively starting with 2 and increasing until the resulting velocity is sufficiently small that the last link in the cluster fragment (nearest the edge) can be processed and sufficient stopping distance remains for the stage.

Simply processing this cluster fragment at V/n will result in the laser firing rate being reduced to Q/n (Q=20,000 in this example). This may produce undesirable variations in the quality of link cutting for those links in the fragment subjected to a different laser Q-rate. This variation is eliminated in the algorithm by introducing the concept of "blast-per-pitch" (bpp). Normally, bpp=1 and the laser is fired once for each pitch of motion of the stage. When a fragment is to be processed at V/n, the bpp is set to n. The system of FIG. 1 recognizes this parameter and fires the laser at a constant rate equal to n*(V/n)/p=V/p=Q. The system "pretends" that there are n–1 "phantom" links equally distributed between each physical link. This forces the laser Q-rate to be identical to the Q-rate used for all other links and ensures consistent cut quality across all links.

There is one further optimization performed by the algorithm that affects links near the edge of the user envelope. The link sorting algorithm includes a parameter (T_settle) that specifies how long the stage should persist at cutting velocity before the first link in a group. Typically, a PVT segment (i.e., a segment in which accel/decl of the stage occurs) will precede a CV segment (i.e., a segment where the stage velocity is constant and laser cutting occurs). If T_settle is set to zero, then the first link to be cut will occur at precisely the end of the PVT segment and the start of the CV segment. In some cases, the stage may not have fully settled to the required level of precision in the absence of any settle time. This could lead to misplacement of the laser with respect to the first few links in a group.

The T-settle parameter can be used to pre-extend the nominal CV segment for a distance equal to V*T_settle. This gives the stage some time to settle and improves system accuracy at a slight cost to throughput. The parameter is typically a few milliseconds.

A non-zero value for T_settle affects the handling of "edge" links. The extension of the CV segment to accommodate T_settle is only applied at the start of a segment. The algorithm is free to choose the preferred direction in which to cut a group of links. If an edge group is processed starting from the edge and moving toward the interior of the envelope, then the distance (D_settle) needed to accommodate T_settle will further reduce the distance needed to accelerate from 0 to V/n. Since the first link location is fixed, this implies that an even lower velocity will need to be applied to the group if it is processed "inward."

If the group is processed "outward" (stage coming to a stop just before the physical limits of travel), the D_settle distance will extend the link toward the interior of the stage envelope without forcing a further reduction on link cutting velocity for the fragment.

It would seem obvious to process edge cluster fragments in the "outward" direction in order to maximize cutting velocity. That is not always the case. It is the function of the sorting algorithm to find the best direction.

Sorting Clusters

The sorting algorithm begins at a starting location ($P_i$). This location corresponds to the final location reached at the end of the site alignment operation (usually near a corner of the site). The starting velocity ($V_i$) is assumed to be zero.

The sorting algorithm determines the cost of processing all "available" clusters in each of two possible directions. The cost is calculated as follows:

$$\text{Cost} = T_{pvt} + E_{pvt}/Kp + T_{cvt}$$

where:

$T_{pvt}$ is the time to move from ($P_i$; $V_i$) to the start of the group;

$E_{pvt}$ is the energy expended in the motor coils during the move;

Kp is the weighting factor (units of power) applied to motor energy; and $T_{cvt}$ is the time required to complete the CV segment.

For each cluster, the move is assumed to start at ($P_i$; $V_i$). Two values of cost are calculated for each cluster—one for each direction. The cost for different directions may be substantially different.

A parameter called N_level is used to control the sorting algorithm. If N_level is set to 1, then the cluster/direction combination that exhibits the lowest cost is selected as the first cluster to process. It is removed from the list of "available" clusters and placed at the head of the "process list." The starting locations ($P_i$; $V_i$) are updated to reflect the position and (non-zero) velocity that occur at the end of processing the first cluster.

The sorting algorithm re-computes the cost for all available clusters/directions. Note that the costs determined in the second step bear no relationship at all to those found in the first step due to substantially different starting conditions. The impact of non-zero starting and ending velocity on cost may not be obvious. The process of selecting the lowest cost cluster/direction combination from the set of available proceeds until no clusters are available.

The parameter N_level controls the extent of the search for the best cluster order. In the example given above with N_level set to 1, the consequence of selecting the best cluster/direction to process is not considered. It is quite possible that selecting the best cluster may lead to a less efficient ordering of subsequent clusters.

The truly optimum selection can be made if, in addition to finding the best solution, all consequences of that selection can be explored. Then, in consideration of all consequences, the best solution is selected.

For example, suppose one starts with ten (10) clusters that require sorting. One considers the cost of twenty (20) initial combinations of clusters/directions. We can select the best five (for example) from this list of twenty. Then, this list of five is further examined. For each of the five, the eighteen (18=2*9) clusters that remained to be processed are considered. From this list, one selects the top five and considers the sixteen (16=2*8) clusters for each of the five. Then, the top five is selected from this list and the remaining clusters are considered. This process is continued until no clusters remain to be sorted. One then calculates the total cost for each of the first five clusters considered. The total cost is found by summing the cost for the best solution selected from all the underlying cluster selections. After all that, one cluster is selected and can repeat the whole process again for the remaining set.

Clearly, this exhaustive search to find the best cluster is computationally very expensive for a large number of clusters. Typical repair data for a site with multiple die may range from a few tens of clusters to hundreds of clusters. The exhaustive search would be prohibitively time-consuming for sites with many clusters.

Fortunately, experience with real repair data indicates that the benefits of an exhaustive search over a 1-level deep (N_level=1) search are small. If N_level is set to 3 (for instance), then the search will be conducted for 3-levels.

Note that the successive levels of search are only performed for the best M clusters (M=5, above) after the first level. While this does leave the chance that a sub-optimal ordering may be selected, it is felt that the extra cost associated with a "bad" first choice cannot be overcome by beneficial consequences (found at subsequent levels of search).

There is a qualitative argument that can be made to support the experimental observation that the sorting algorithm does not benefit from a large value of either M or N_level. For typical repair data, the stage will spend between 80 and 90% for the total time in CV segments firing the laser. Re-ordering the data does not affect the CV processing time. Re-ordering optimizes the PVT time (slight) and can have a dramatic impact on the energy dissipated. However, once a "reasonable" path through the available clusters is found (N_level=1), setting N_level to 2 or 3 results in a further time savings of only a few percent. Carrying the sorting to the maximum level results in vanishingly small improvements over N_level=3.

While large values of N_level make little improvement, sorting with N_level in the range of 1 to 3 can have a dramatic impact on energy dissipation and spectral content. The sorting algorithm finds opportunity to conserve momentum (since no energy is dissipated if momentum is conserved). Stage momentum is conserved, for instance, when two clusters in adjacent die can be processed without an intervening PVT segment. Adjacent groups of links are a frequent occurrence. The sorting algorithm will find a smooth motion profile that transitions from the end of the link groups in one row to the start of link groups in the other. This smooth profile is generally faster, dissipates less energy and has much lower spectral content than traditional profiles that perform the transition in three steps: stop, hop, start.

Finally, an example will illustrate why the choice of direction to process edge link groups may not always be intuitive. Consider a cluster at the extreme +X edge of a site. Assume the original cluster must be broken into two resulting in a cluster fragment. If the fragment cluster were traversed in the +X direction, it could be processed at a higher velocity than if it is processed in the −X direction due to the impact of T_settle. During cluster sorting (assume N_level=1), suppose one has just selected the original cluster processed in the +X direction. During the next pass of the sorting algorithm, the cost for processing the fragment is determined assuming +X processing and −X processing. The cost will consider the time difference during the CV segment based on the different achievable velocities as a function of direction. However, recall that the fragment cannot be processed at the same velocity as the preceding cluster. There is often insufficient distance after the end of the preceding cluster (the original cluster, now cut) and the fragment to allow the stage to decelerate to the +X fragment velocity. The cost associated with trying to process the fragment in the +X direction following the +X traversal of the original cluster results in a rapid decel (from the original cluster) to a −X velocity, then an accel to a lower +X velocity to traverse the site.

The cost to traverse the fragment in the −X direction is often less since the stage is able to make a smoother transition (i.e., lower energy expenditure) coming to a stop near the extreme of the envelope and then accelerate to a lower velocity (−X direction) just in time to reach the outermost link in the cluster fragment. The weighted energy savings (E/Kp) often is more significant than the increased Tcv time.

Solution Benefits

The cluster sorting algorithm exhibits the following benefits over prior practice:

1. The algorithm considers links across the entire site. This leads to optimizations (chances to conserve momentum) that would not be realized if the sorting were performed on a die-by-die basis.
2. The algorithm explicitly considers groups near the edge of the envelope and processes them in the most efficient manner subject only to the actuator limits.
3. The algorithm considers the initial and final velocities as well as distance between the end of one group and the start of the next. This makes explicit the merging of nearby groups. Prior algorithms would merge nearby groups depending only upon preset distance criteria. Selecting the proper distance threshold to merge became very important. In the algorithm, the only motivation to merge any nearby groups is to reduce the number of clusters that need to be analyzed. This leads to a choice of merge distance much shorter (that is, do not merge groups that are greater than x apart) than prior algorithms. The sorting will place the "un-merged" clusters in succession, with possibly a PVT segment in contrast to a CV segment, between the groups. That is, if the initial "clustering" step does not merge the clusters, they can still be merged by the sorting step.
4. Conversely, the "un-merged" clusters may be better processed out of sequence. This becomes evident when examining the trajectories resulting from sorting the same data set starting with four different starting locations corresponding to the four corners of the site.
5. The algorithm implicitly reduces the spectral content and energy dissipation associated with processing the site. Since power dissipation is included in the cost formulation, optimizing cost leads to lower energy dissipation. Less obvious perhaps is that the same optimization leads to fewer acceleration pulses of longer duration.

Segment Planning

The multi-pulse profile is overconstrained—there are more parameters of the profile than there are boundary conditions. In many cases, one can fit the boundary conditions using more than one combination of pulses and cruises; for a single combination, there may be an infinite number of solutions as well.

To refer to a particular combination of intervals with brevity, one would abbreviate pulse as P, and cruise as C; e.g., a pulse/cruise/pulse segment will be called a PCP. When relevant, one would also distinguish between situations where minimum time is to be computed ("M"), and where time is specified ("T"). For example, one would have the PCP-M and PCP-T solutions, which are, in fact, quite different.

Figure 6:
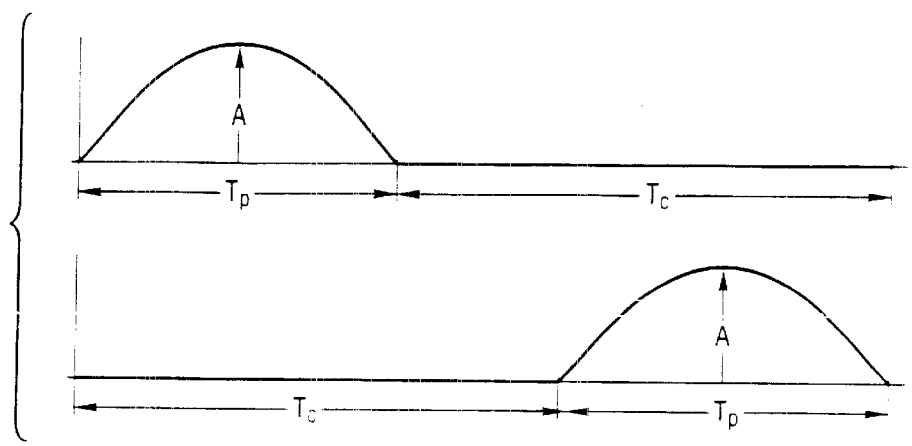
FIG. 6 shows graphs of amplitude versus time and illustrating a pulse/cruise profile of a motion segment.

Several different interval combinations, or structure types, will be implemented. If one does not have a general solution, even still, some sets of boundary conditions have infinitely many solutions. Sometimes, more than one type solves the boundary condition. In that case, one would choose the minimum-cost solution. For each type, both −M and −T solutions have been implemented. The types currently solved are:

Pulse/Cruise of FIG. 6: This generates C, P, CP, and PC segments.

Figure 7:
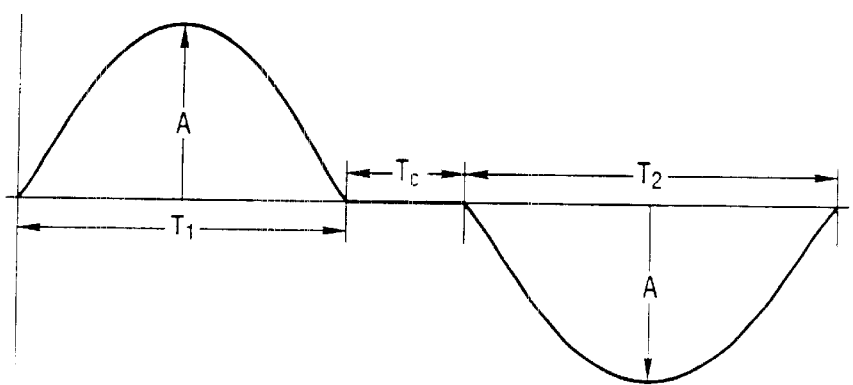
FIG. 7 is a graph of amplitude versus time and illustrating a pulse/pulse profile of a motion segment.

Pulse/Pulse of FIG. 7: This generates PP and PCP segments. The pulses have the same acceleration magnitude but opposite sign; the pulse times are independent. If the velocity at the end of the first pulse exceeds the maximum, a cruise interval at maximum velocity is used, forming a PCP segment.

Figure 8:
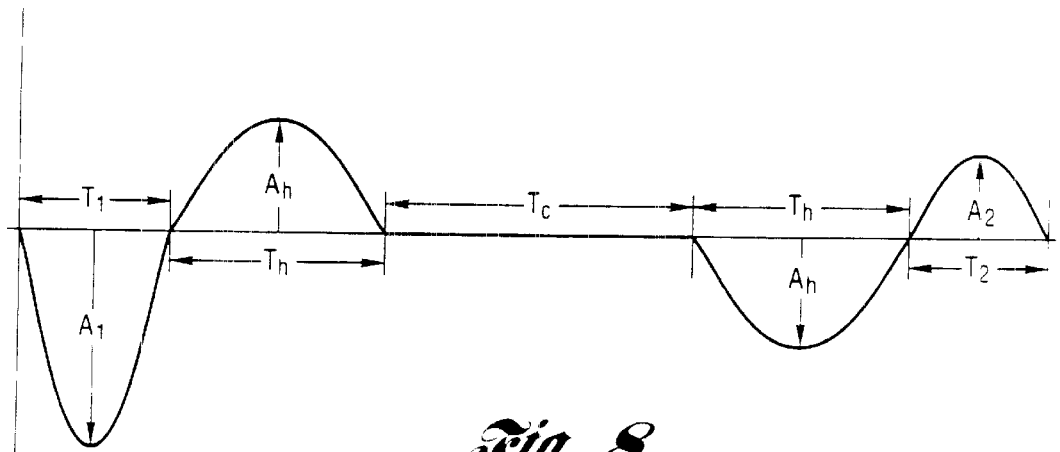
FIG. 8 is a graph of amplitude versus time and illustrating a stop/hop/start profile of a motion segment.

Stop/Hop/Start of FIG. 8: This is also called a Z move. This generates a PPCPP segment, and the −T solution can also generate a PPCPCP segment. This is a last-ditch solution if no other solutions are feasible. It involves an immediate stop, a PCP point-to-point move and stop to a "staging point," and then a final pulse to accelerate to the final position and velocity.

This segment type typically takes more time and more energy than other types. However, observing position constraints may make it essential for a few, hopefully infrequent, set of boundary conditions.

The strategy for solving a given multi-axis PVT segment is as follows:

1. Obtain the minimum time motion for each axis (i.e., solve the axis-M problem). Pick the largest of these times. Solve for the other axes using the time-specified (axis-T) solution.

The following sequence is used to solve both the minimum-time and time-specified problems:

1. Attempt to plan a PC and PP segment. Keep a list of the best feasible solution of each type.
2. If there is a feasible solution, pick the one with the lowest cost.
3. If nothing so far is feasible, plan a Stop/Hop/Start move.

Feasibility checking includes both numerical checks, e.g. that the interval time is non-negative, and physical checks, e.g., that voltage, velocity, and position constraints are not violated.

The following is a table that summarizes formulas derived for cycloidal and harmonic multi-pulse acceleration.

TABLE SUMMARY OF MULTI-PULSE FORMULAS

| Item | Cycloid | Harmonic |
|---|---|---|
| Acceleration | $a(t) = A\sin\frac{\pi}{T}t$ | $a(t) = \frac{A}{2}\left(1 - \cos\frac{2\pi}{T}t\right)$ |
| Velocity | $v(t) = v_i + \frac{AT}{\pi} - \frac{AT}{\pi}\cos\frac{\pi t}{T}$ | $v(t) = v_i + \frac{A}{2}t - \frac{AT}{4\pi}\sin\frac{2\pi t}{T}$ |
| Position | $p(t) = p_i + \left(v_i + \frac{AT}{\pi}\right)t - \frac{AT^2}{\pi^2}\sin\frac{\pi t}{T}$ | $p(t) = p_i + v_i t + \frac{A}{4}t^2 + \frac{AT^2}{8\pi^2}\left(\cos\frac{2\pi t}{T} - 1\right)$ |
| Jerk | $j(t) = \frac{A\pi}{T}\cos\frac{\pi t}{T}$ | $j(t) = \frac{\pi A}{T}\sin\frac{2\pi t}{T}$ |
| Single Pulse | $\Delta v = \frac{2AT}{\pi}$ <br> $\Delta p = Tv_i + \frac{AT^2}{\pi}$ <br> $= Tv_f - \frac{AT^2}{\pi}$ | $\Delta v = \frac{AT}{2}$ <br> $\Delta p = Tv_i + \frac{AT^2}{4}$ <br> $= Tv_f - \frac{AT^2}{4}$ |
| Start or Stop | $\Delta p = \frac{\pi \Delta v^2}{4A}$ | $\Delta p = \frac{\Delta v^2}{A}$ |
| Point-to-Point Motion | $\Delta p = \frac{2AT^2}{\pi}$ | $\Delta p = \frac{AT^2}{2}$ |
| Pulse Energy | $E = \frac{1}{2}\left(\frac{A^2 T}{K_s}\right)$ | $E = \frac{3}{8}\left(\frac{A^2 T}{K_s}\right)$ |
| Minimum-Cost Pulse | $A = \sqrt{2K_p K_s}$ | $A = \sqrt{\frac{8}{3}K_p K_s}$ |
| Pulse-Only Solution | $A = \frac{\pi \Delta v}{4\Delta p}(2v_i + \Delta v)$ | $A = \frac{\Delta v}{\Delta p}(2v_i + \Delta v)$ |
| Pulse/Cruise, Time Specified | $A = \begin{cases} \frac{\pi \Delta v^2}{4(\Delta p - Tv_i)}, & \text{Cruise/Pulse} \\ \frac{\pi \Delta v^2}{4(Tv_f - \Delta p)}, & \text{Pulse/Cruise} \end{cases}$ | $A = \begin{cases} \frac{\Delta v^2}{\Delta p - Tv_i}, & \text{Cruise/Pulse} \\ \frac{\Delta v^2}{Tv_f - \Delta p}, & \text{Pulse/Cruise} \end{cases}$ |
| Pulse/Cruise, Minimum Cost | $A = \begin{cases} \sqrt{-\frac{K_p K_s \Delta v}{v_i}}, & \text{Cruise/Pulse} \\ \sqrt{\frac{K_p K_s \Delta v}{v_f}}, & \text{Pulse/Cruise} \end{cases}$ | $A = \begin{cases} \sqrt{-\frac{4}{3}\frac{K_p K_s \Delta v}{v_i}}, & \text{Cruise/Pulse} \\ \sqrt{\frac{4}{3}\frac{K_p K_s \Delta v}{v_f}}, & \text{Pulse/Cruise} \end{cases}$ |
| Pulse/Pulse, Time Specified | Solve for A: <br> $\frac{T^2}{\pi}A^2 + (T(v_i + v_f) - 2\Delta p)A - \frac{\pi \Delta v^2}{4} = 0$ | Solve for A: <br> $\frac{T^2}{\pi}A^2 + (T(v_i + v_f) - 2\Delta p)A - \Delta v^2 = 0$ |
| Pulse/Pulse, Acceleration Specified | Solve for T: <br> $\frac{1}{2}T^2 + \frac{\pi(v_i + v_f)}{2A}T - \frac{\pi}{A}\left(\frac{\pi}{A}\frac{\Delta v^2}{8} + \Delta p\right) = 0$ | Solve for T: <br> $\frac{1}{2}T^2 + \frac{2(v_i + v_f)}{A}T - \frac{2}{A}\left(\frac{\Delta v^2}{A} + 2\Delta p\right) = 0$ |

While the best mode for carrying out the invention has been described in detail, those familiar with the art to which this invention relates will recognize various alternative designs and embodiments for practicing the invention as defined by the following claims.

What is claimed is:

1. A method for determining a sequence in which microstructures are to be processed at a laser-processing site, the method comprising:
   receiving reference data which represent locations of microstructures to be processed at the site;

coalescing adjacent groups of microstructures into clusters of microstructures including edge clusters which contain microstructures located near travel limits of a motor-driven stage, wherein the motor-driven stage moves the microstructures relative to a laser beam at the site;

dividing a cluster fragment from each edge cluster, the cluster fragment being defined such that a microstructure within the fragment is located near a travel limit; and sorting the clusters and cluster fragments to obtain data which represent a substantially optimum sequence in which the microstructures are to be processed to increase throughput at the site.

2. The method as claimed in claim 1 wherein the step of sorting is based on energy expended in at least one coil of at least one motor in response to motor commands.

3. The method as claimed in claim 1 wherein each of the cluster and cluster fragments has a plurality of possible processing directions and wherein the step of sorting includes the step of determining a substantially optimum direction in which to process the microstructures.

4. The method as claimed in claim 1 wherein the step of sorting includes the steps of selecting a substantially optimum cluster or cluster fragment to be initially processed at the site, then determining a plurality of possible sequences for processing the remaining clusters and cluster fragments and selecting a substantially optimum sequence from the plurality of possible sequences.

5. The method as claimed in claim 1 wherein the microstructures are located on dice of a wafer.

6. The method of claim 1 wherein dividing includes identifying a first microstructure subjected to a speed constraint less than a pre-determined maximum processing velocity.

7. The method of claim 1 wherein the motor driven stage is driven at a maximum processing velocity, and wherein a slower processing velocity is the maximum velocity divided by an integer, wherein a substantially constant laser q-rate is maintained.

8. The method of claim 1 wherein dividing includes an algorithm for link sorting.

9. The method of claim 1 the method further comprising positioning the laser beam and the motor-driven stage.

10. A subsystem for determining a sequence in which microstructures are to be processed at a laser-processing site, the subsystem comprising:

means for receiving reference data which represent locations of microstructures to be processed at the site;

means for coalescing adjacent groups of microstructures into clusters of microstructures including edge clusters which contain microstructures located near travel limits of a motor-driven stage, wherein the motor-driven stage moves the microstructures relative to a laser beam at the site;

means for dividing a cluster fragment from each edge cluster, the cluster fragment being defined such that a microstructure within the fragment is located near a travel limit; and means for sorting the clusters and cluster fragments to obtain data which represent a substantially optimum sequence in which the microstructures are to be processed to increase throughput at the site.

11. The subsystem as claimed in claim 10 wherein the means for sorting sorts based on energy expended in at least one coil of at least one motor in response to motor commands.

12. The subsystem as claimed in claim 10 wherein each of the clusters and cluster fragments has a plurality of possible processing directions and wherein the means for sorting includes means for determining a substantially optimum direction in which to process the microstructures.

13. The subsystem as claimed in claim 10 wherein the means for sorting includes means for selecting a substantially optimum cluster or cluster fragment to be initially processed at the site, for determining a plurality of possible sequences for processing the remaining clusters and cluster fragments and for selecting a substantially optimum sequence from the plurality of possible sequences.

14. The subsystem as claimed in claim 10 wherein the microstructures are located on dice of a wafer.

15. The subsystem as claimed in claim 14 wherein the microstructures are conductive lines of the dice.

16. The subsystem as claimed in claim 15 wherein the dice are semiconductor memory devices and wherein the conductive lines are to be ablated at the site to repair defective memory cells of the devices.

17. The subsystem as claimed in claim 10 wherein the microstructures are parts of a semiconductor device.

18. The subsystem as claimed in claim 17 wherein the semiconductor device is a microelectromechanical device.

19. The subsystem as claimed in claim 17 wherein the semiconductor device is at least one of a silicon semiconductor device and a semiconductor memory.

20. The subsystem as claimed in claim 11 wherein the stage is an x-y stage and wherein the means for sorting sorts based on energy expended in a plurality of coils of a plurality of motors in response to motor commands.

21. The sub-system of claim 10 wherein dividing includes identifying a first microstructure subjected to a speed constraint less than a pre-determined maximum processing velocity.

22. The sub-system of claim 10 wherein the motor driven stage is driven at a maximum processing velocity, and wherein a slower processing velocity is the maximum velocity divided by an integer, wherein a substantially constant laser q-rate is maintained.

23. The sub-system of claim 10 wherein the means for dividing includes an algorithm for link sorting.

24. The sub-system of claim 10 further comprising means for positioning the laser beam and the motor-driven stage.

* * * * *